(12) United States Patent
Lee

(10) Patent No.: US 11,925,026 B2
(45) Date of Patent: Mar. 5, 2024

(54) STRUCTURES FOR NOVEL THREE-DIMENSIONAL NONVOLATILE MEMORY

(71) Applicant: Sang-Yun Lee, Hillsboro, OR (US)

(72) Inventor: Sang-Yun Lee, Hillsboro, OR (US)

(73) Assignee: BESANG, INC.

( * ) Notice: Subject to any disclaimer, the term of this patent is extended or adjusted under 35 U.S.C. 154(b) by 332 days.

(21) Appl. No.: 17/340,371

(22) Filed: Jun. 7, 2021

(65) Prior Publication Data
US 2022/0392913 A1   Dec. 8, 2022

(51) Int. Cl.
| | |
|---|---|
| H10B 43/40 | (2023.01) |
| G11C 5/06 | (2006.01) |
| H01L 23/48 | (2006.01) |
| H01L 23/535 | (2006.01) |
| H10B 41/20 | (2023.01) |
| H10B 41/30 | (2023.01) |
| H10B 41/40 | (2023.01) |
| H10B 41/41 | (2023.01) |
| H10B 43/20 | (2023.01) |
| H10B 43/30 | (2023.01) |

(52) U.S. Cl.
CPC ............ *H10B 43/40* (2023.02); *G11C 5/063* (2013.01); *H01L 23/481* (2013.01); *H01L 23/535* (2013.01); *H10B 41/20* (2023.02); *H10B 41/30* (2023.02); *H10B 41/40* (2023.02); *H10B 41/41* (2023.02); *H10B 43/20* (2023.02); *H10B 43/30* (2023.02)

(58) Field of Classification Search
CPC ........ H10B 43/40; H10B 41/20; H10B 41/30; H10B 41/40; H10B 41/41; H10B 43/20; H10B 43/30; H10B 41/10; H10B 43/10; G11C 5/063; H01L 23/481; H01L 23/535
See application file for complete search history.

(56) References Cited

U.S. PATENT DOCUMENTS

2009/0294833 A1* 12/2009 Kim ................... H10B 12/50
                                                    257/324

* cited by examiner

*Primary Examiner* — Allison Bernstein
(74) *Attorney, Agent, or Firm* — Jeong Y. Choi

(57) ABSTRACT

Disclosed are novel structures and methods for 3D NVM built with vertical transistors above a logic layer. A first embodiment has a conductive film under the transistors and serving as a common node in a memory block. The conductive film may be from a semiconductor layer used to build the transistors. Metal lines are disposed above the transistors for connection through 3D vias to underlying circuitry. Contact plugs may be formed between transistors and metal lines. The conductive film may be coupled to underlying circuitry through contacts on the conductive film or through interconnect vias underneath the film. A second embodiment has conductive lines disposed under the transistors. Either of conductive lines and metal lines may serve as source lines and the other as bit lines for the memory. For low parasitic resistances, the conductive lines may be shorted to bypass metal lines residing in underlying logic layer.

46 Claims, 8 Drawing Sheets

100

100

100

100

100

100

400

400

STRUCTURES FOR NOVEL THREE-DIMENSIONAL NONVOLATILE MEMORY

TECHNICAL FIELD

The present disclosure relates generally to the technical field of semiconductor memory devices, more specifically structures and methods for nonvolatile memories ("NVMs").

BACKGROUND

There are various types of NVM available in the industry. Choice of an NVM type is often based on overall manufacturing cost per unit memory cell which is usually determined by the memory density and the ratio of the memory area to the overall chip size. Another common criterion for the choice of NVM type is the application, i.e. whether the use is for storage of mass data or of self-starting code.

Usually aside from one-time programmable NVMs, one of the criteria for NVM classification is the structure between the gate and channel of the MOSFET (metal-oxide-semiconductor field-effect transistor) in each of the memory cells. The type that is more widely used in high-density NVMs has a charge-trap region in the gate dielectric of the transistor in each of the unit memory cells. This is particularly true of three-dimensional (3D) NVMs. The charge-trap region is typically the interface between two different dielectrics such as oxide and silicon nitride. The other type that is less commonly used in high-density NVMs has a floating gate between the channel and control gate of the transistor. The floating gate is completely surrounded by dielectric films. Floating-gate type entails a higher manufacturing cost than charge-trap type, but is more robust against wear-out of the gate dielectric.

A second criterion for NVM classification is how the charges are stored into the charge-trap region or floating gate and removed from that charge-storage node, i.e. how the cells are programmed and erased. EPROMs (erasable programmable read-only memories) are programmed by electron tunneling, and erased by ultraviolet illumination. EEPROMs (electrically erasable programmable read-only memories) use electron tunneling for erase and program operations, but the polarity of the electric field in the gate dielectric during erase is opposite of that during program. Flash memories are like EEPROMs except programming may rely on hot-carrier effects and the erase operation erases a block of memory cells simultaneously with no capability to erase a single bit at a time.

A third criterion for the classification of NVMs, especially flash memories, is how individual memory cells are coupled to the external lines. In NAND type, a group of memory cells (typically constituting a byte or word) are connected in series in a manner like a NAND gate. The cell at one end of the series connection is coupled directly to a source line and the cell at the other end directly to a bit line. In order to access a cell in a group, particularly for read, all the other cells in the group must be heavily turned on so that the selected cell dominates (or limits) the current flowing through the cells in the group. Cells within a series-connected group are accessed sequentially, one at a time. In NOR type, one end of each memory cell is directly coupled to a source line and the other end directly to a bit line, similar to a NOR gate. Each cell of a NOR-type memory may be accessed randomly with no need to turn on adjacent cells, and any group of cells, whether adjacent or not, may be accessed simultaneously.

Usually NOR-type NVMs are used to store codes that need to start executing automatically (i.e. without an external trigger). Since NOR-type NVMs are 2-3 times larger in cell size and thus higher in per-bit cost than NAND-type, the former are usually disfavored for mass data storage. On the other hand, NAND-type NVMs are usually disfavored for code storage because they are much slower and require external signal to trigger running of the code.

Technologies available so far for manufacturing flash memories are usually tuned specifically to the cell layout. It is therefore not surprising that very different designs of NOR- and NAND-type cells involve different technologies for manufacturing, whether the structure is two- or three-dimensional and whether their program and erase mechanisms are the same or different. Any change in the cell architecture, even within the same type, requires a significant modification of the process technology. Companies need to develop two different technologies in each technology generation in order to manufacture both NOR and NAND flashes, or need to choose one over the other.

In most (if not all) 3D NVMs available in the industry so far, memory cells in a particular group are connected and accessed in series, and thus suitable for a NAND flash but nearly (if not completely) impractical to operate as a NOR flash. In order to make a NOR flash based on existing technologies, the cell size of 3D NVMs must increase by a factor of at least two or three, not to mention the complexity and cost of the technology for manufacturing such.

There have been efforts for making NAND flashes with NOR cells by properly designing a memory control circuit that interprets NAND operational codes. However, such pseudo-NAND flashes were not competitive in the market because of larger cell size and consequently higher cost per cell. There have been other efforts for making NOR flashes with NAND cells by properly designing a memory control circuit that interprets NOR operational codes. However, such pseudo-NOR flashes, although attractive in terms of cost per cell, were not competitive in terms of operating speeds.

SUMMARY

Novel structures of 3D NVM are disclosed herein, together with methods for making the novel structures. Basic building elements of the memory cells are vertical transistors made of semiconductor pillars. The memory cells in the present disclosure are NOR type in construction but with the same footprint as any competitive NAND-type cells. For this reason, the 3D NVM of the present disclosure, provided a memory controller is properly designed, can be used as a NOR and/or NAND flash with no risk in speed for NOR and in cost for NAND. Any portion of the 3D NVM may be operated as NOR and the remainder as NAND.

At an early stage of a manufacturing process, a conductive layer is disposed on a logic layer built on a substrate. The logic layer includes memory control circuits. The conductive layer is a semiconductor layer disposed directly on the logic layer but may optionally be a stack of a semiconductor layer on a metallic film.

In accordance with a first embodiment of the present disclosure, the memory-cell transistors share a common node within each block of the memory module. A block mask is used to form the blocks. In a first alternative, the conductive layer is a semiconductor layer that is directly disposed on the logic layer. The semiconductor layer is patterned into blocks, exposing the top surface of the logic layer between the blocks. In a second alternative, there is a metallic film under the semiconductor layer. The metallic film is patterned together with the semiconductor layer. In such a case, blocks of a stack of metallic film and semiconductor layer would be formed.

The blocks of semiconductor layer or of a stack of metallic film and semiconductor layer are transformed into semiconductor pillars. In the first alternative, the semiconductor layer is partly etched to become a semiconductor film while being patterned into the semiconductor pillars. In the second alternative, the semiconductor layer is completely removed outside the semiconductor pillars and exposes the metallic film. Thus, semiconductor pillars standing on semiconductor film or metallic film are formed.

Typically, semiconductor pillars are patterned with two masks, particularly in advanced technology nodes such as 20 nm or smaller. A first pillar mask cuts the semiconductor layer into strips stretching in bit-line direction, while a second pillar mask comprising lines that stretch in word-line direction cuts the semiconductor strips into pillars.

The semiconductor pillars are bodies of memory-cell transistors. With the formation of a gate stack on the vertical sidewall of each pillar, a transistor is made. To make an NVM cell, a tunneling dielectric and a coupling dielectric are disposed on each pillar before patterning a control gate on the coupling dielectric. In a first option for the transistor formation, a charge-trap layer is disposed on the tunneling dielectric before disposing the coupling dielectric. In a second option for the transistor formation, a floating gate is patterned on the tunneling dielectric before disposing the coupling dielectric. The floating gate is completely surrounded by the tunneling dielectric and the coupling dielectric. The control gate, as well as the floating gate in the second option, is patterned by etching a respective gate material anisotropically. A mask may be used for the control gate in order to provide a landing pad to facilitate gate contact formation.

A dielectric layer is disposed on the memory-cell transistors, filling the spaces between control gates, between semiconductor pillars outside the control gates, etc. 3D vias are made through the dielectric layer outside or between blocks of semiconductor film or metallic film in order to couple the memory-cell transistors to memory control circuits residing in the logic layer. Metal lines are then disposed on the dielectric layer to couple the memory-cell transistors to the 3D vias. The metal lines stretch along bit-line direction.

In a first option of forming the metal lines above the memory-cell transistors, a metal layer is disposed on the dielectric layer and then patterned into metal lines. The dielectric layer is planarized to expose the top horizontal surface of the semiconductor pillars before disposing the metal layer. In a second option, the dielectric layer does not expose the top horizontal surface of the semiconductor pillars. Grooves are formed in the dielectric layer exposing top portions of the semiconductor pillars and the 3D vias within the grooves. Then a metal layer is disposed to fill the grooves and planarized to expose the top surface of the dielectric layer between the grooves. In either option, contact plugs may be disposed on the top surface of the semiconductor pillars before forming the metal lines.

There are options for coupling the bottom portions of the semiconductor pillars, or the bottom electrodes of the memory-cell transistors, to the underlying logic layer. A first option is to provide contacts on the semiconductor film or metallic film that provides a common node for the semiconductor pillars in respective blocks. Simultaneously with the above-mentioned 3D vias, a second set of 3D vias are formed through the dielectric layer outside or between the blocks of semiconductor film or metallic film. Separate pieces of the metal lines connect the contacts and the second set of 3D vias made for the first option. A second option forms interconnect vias in the top portion of the logic layer before disposing the conductive layer on it. The conductive layer as disposed is in contact with the underlying interconnect vias.

According to a second embodiment of the present disclosure, the semiconductor pillars are formed on a semiconductor lines or conductive lines. The semiconductor layer is completely etched with the first pillar mask to become semiconductor strips. At the second masking step, the semiconductor strips are partly etched. When a metallic film is present under the semiconductor layer, the metallic film is completely etched at the first masking step so as to become conductive lines. The second masking step stops the etching upon encountering the conductive lines. Alternatives and options of the first embodiment are equally applicable to the second embodiment.

The second embodiment renders the block mask of the first embodiment unnecessary because the semiconductor layer (as well as metallic film if present) is completely etched during the first masking step of forming the semiconductor pillars. Also, the second embodiment offers an opportunity of optimizing the biases on selected vs. unselected word lines and bit lines because the cells on a bit line can have a dedicated source line, not shared with cells on other bit lines within the same block of memory. Concerns of high resistance along the conductive lines of the second embodiment can be addressed by disposing bypass metal lines of lower resistance in the logic layer connected to the conductive lines by bypass vias in the logic layer or by the combination of contacts on the conductive lines, metal lines over the semiconductor pillars, and 3D vias.

BRIEF DESCRIPTION OF THE DRAWINGS

Example embodiments are illustrated by way of example and not limitation in the figures of the accompanying drawings, in which like references indicate similar elements.

FIG. 2C shows a cross-sectional view of the structure cut along a bit line, and FIG. 2D along a word line. Dielectric layer 217 is not shown in figures illustrating the 3D views of the structure. FIG. 2D is intended to clearly show the cross-sections of grooves 218 in word-line direction that may not be readily perceived in FIG. 2C.

Figure 1A:
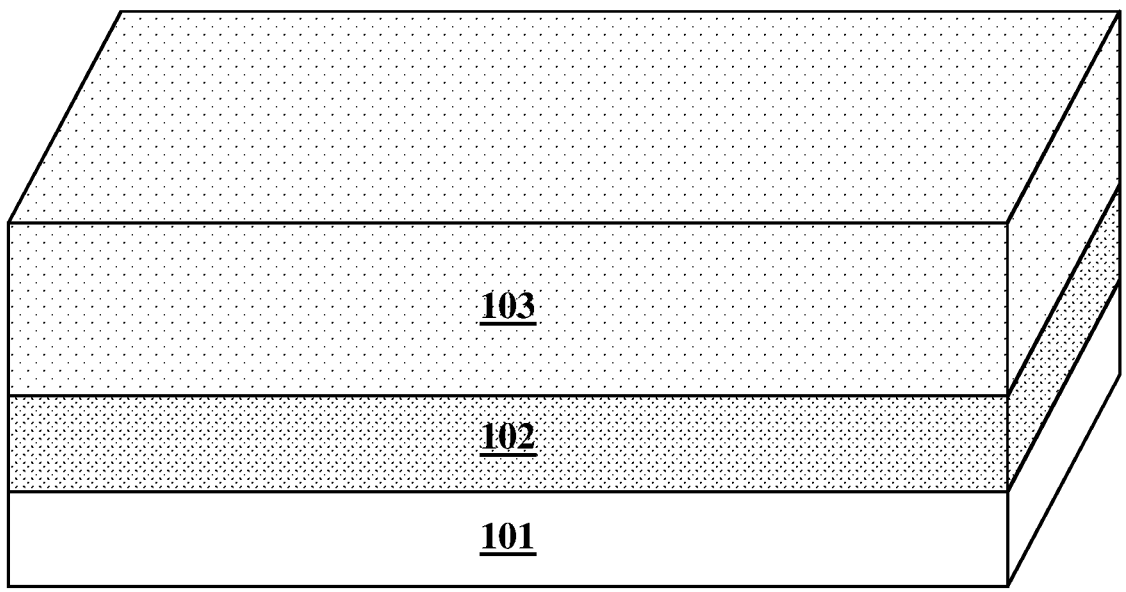
FIG. 1A is a structure 100 illustrating a first embodiment of the present disclosure at an early stage of a manufacturing process after a logic layer 102 is constructed on a substrate, and a conductive layer 103 is disposed over the logic layer. The conductive layer may be a single layer of semiconductor or a stack of a metallic film and semiconductor layer.

The drawings referred to in this description should be understood as not being drawn to scale, except if specifically noted, in order to show more clearly the details of the present disclosure Like reference numbers in the drawings indicate like elements throughout the several views Like fill patterns in the drawings indicate like elements throughout the drawings, in the absence of like reference numbers. Other features and advantages of the present disclosure will be apparent from accompanying drawings and from the detailed description that follows.

DETAILED DESCRIPTION

Structures and methods for a novel 3D NVM are disclosed. In the following description, for the purposes of explanation, numerous specific details are set forth in order to provide a thorough understanding of the various embodiments. However, it will be evident that one skilled in the art may practice various embodiments within the scope of this disclosure without these specific details.

Vertical transistors made of semiconductor pillars (often referred to merely as "pillars" hereinafter) residing above a conventional planar circuitry are the basic building blocks giving the 3D nature to the memory of the present disclosure. The 3D NVM of the present disclosure is basically of a NOR type because the vertical transistor in each cell has its source and drain regions directly coupled to external control lines. But it is not larger in cell size than any competitive NAND cells in the same technology node. The competitiveness of the cell size comes from the use of vertical transistors whose horizontal footprint is only limited by the minimum feature size of the technology, with no other elements (such as bit-line contacts) of the memory cell requiring a horizontal footprint within the cell, regardless of whether used to build a NOR or NAND cell.

Therefore, an operation of the 3D NVM of the present disclosure as a NAND flash involves no disadvantage on a cost-per-bit basis. Thus, one technology developed for the 3D NVM of the present disclosure may equally be used for NOR and NAND flashes. Further, by a proper design of a memory control circuit that interprets both NOR and NAND operational codes, one product can be used as either or both of NOR and NAND flashes with a selection of programmable configurations, with no disadvantage in speed for NOR and in cost for NAND. One may opt to operate a part of the 3D NVM as a NOR flash and the rest like a NAND flash, with the boundary between the two settable anywhere within the 3D NVM by a programmable configuration register. Ordinarily, any change made in that boundary or a switch between NOR and NAND does not destroy or alter the values stored in the 3D NVM, unless the memory control circuit is designed or configured to do so.

FIG. 1A illustrates a structure 100 at an early stage of a manufacturing process in accordance with the present disclosure. A conductive layer 103 is disposed on a logic layer 102 which in turn is built on a substrate 101. The logic layer comprises various logic circuits and memory control circuits built with planar transistors (not shown) and passive elements (not shown), with one or more interconnect layers (not shown) formed for the circuits as well as for the 3D NVM. The top portion of the logic layer is a dielectric (now shown), which is typically an oxide. In a first alternative, the conductive layer is a semiconductor layer alone. In a second alternative, the conductive layer is a stack of a metallic film and a semiconductor layer.

Ordinarily, memory cells are formed in a two-dimensional array and grouped into blocks (often also called banks, etc.). In a first embodiment of the present disclosure, memory-cell transistors share a common node at the bottom in each block. In a first alternative of the first embodiment, the semiconductor layer is used not only to build the memory-cell transistors but also to serve as the common node for the memory-cell transistors. The semiconductor layer is partly etched to leave a semiconductor film while being patterned into semiconductor pillars.

In a second alternative of the first embodiment, the metallic film serves as the common node for the memory-cell transistors while the semiconductor layer disposed on it is used to build the transistors. In this case, the semiconductor layer is completely etched while being patterned into semiconductor pillars.

In the figures of the present disclosure, the first alternative is exclusively illustrated (in terms of the same fill patterns for the semiconductor film and semiconductor pillars), but it should be understood that the illustrated semiconductor film may actually be the metallic film of the second alternative. For this reason, we will use the term "conductive film" throughout the present disclosure to mean "either semiconductor film or metallic film." "Semiconductor layer" may actually mean "semiconductor layer on metallic film," depending on the context. Similarly, we will use the term "conductive lines" for the later-disclosed second embodiment to mean "either semiconductor lines or metallic lines."

The semiconductor layer may be a single-crystalline semiconductor transferred from a donor wafer. A receiving wafer (which is substrate 101 in FIG. 1A and other figures) goes through conventional process steps to build the logic layer. Then, the receiving wafer is prepared for bonding such as by polishing to have a flat top surface. After the polishing, the receiving wafer may optionally be coated with a metallic material on logic layer 102, which serves to enhance the bonding strength and becomes the above-mentioned metallic film of the second alternative. Subsequent to the bonding, the donor wafer is usually cleaved off to leave the semiconductor layer of a desired thickness on the receiving wafer. Since the donor wafer donates a thickness of semiconductor material to another wafer, it is referred to as "donor" wafer. The donor wafer may be reused for another transfer of semiconductor layer to next wafers. Or, after using a wafer as a donor for one production, one may opt to use it as a receiver (or a substrate) for the next production.

Figure 1B:
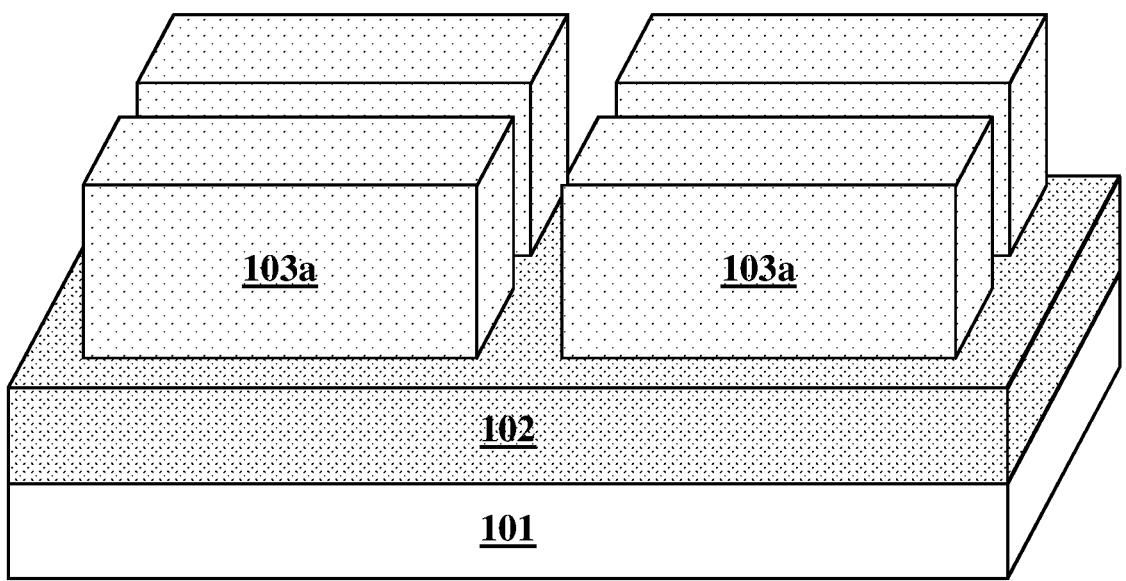
FIG. 1B is structure 100 with further processing on that of FIG. 1A. The conductive layer is patterned into blocks of conductive layer 103*a*.

The semiconductor layer is etched with a block mask (not shown) and transformed into blocks, exposing the top surface of the logic layer between the blocks, as shown in FIG. 1B. In the second alternative, the metallic film is patterned in the same masking step. In such a case, blocks of a stack of metallic film and semiconductor layer would be formed. The dielectric layer at the top of the logic layer is exposed between the blocks of the stack.

Figure 1C:
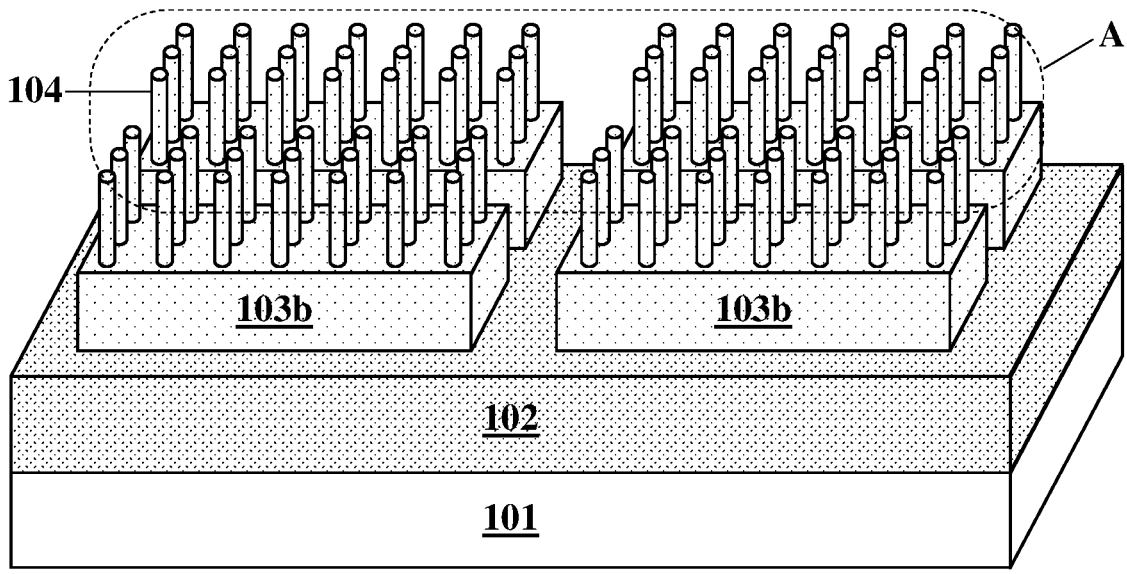
FIG. 1C is structure 100 with further processing on that of FIG. 1B. The blocks of conductive layer are patterned into an array of semiconductor pillars 104 standing on blocks of conductive film 103*b*. "Blocks of conductive film" refers to either blocks of semiconductor film or blocks of metallic film remaining after forming the semiconductor pillars.

After being transformed into blocks, the semiconductor layer is further patterned to form an array of semiconductor pillars in each block. This is illustrated in FIG. 1C. In the first alternative, the semiconductor layer is partly etched outside the semiconductor pillars, so that blocks of thin semiconductor film 103b are formed to serve as common nodes for the array of semiconductor pillars in respective blocks. In the second alternative, the label "103b" refers to blocks of metallic film.

The label 104 in FIG. 1C is not only for the particular pillar which is directly pointed to by the label's lead line, but also all of the pillars in the figure, like those enclosed in dashed rounded rectangle A. Such an inclusive referral is implied in all figures of the present disclosure even without the enclosing circle or rectangle. This convention is to avoid overcrowding. Although very limited number of semiconductor pillars are shown in FIG. 1C and other figures, there are far more of them in each block in actual products.

The semiconductor pillars are usually patterned with two masking steps. A first pillar mask (not shown) comprises long lines stretching along a bit-line direction. A second pillar mask (not shown) comprises long lines that stretch along a word-line direction. The intersection of the two masks upon the final etch leaves semiconductor pillars, each taking a circular shape in a horizontal cross-section due to optical and chemical effects on a small geometry.

As mentioned earlier, in the first alternative of the first embodiment, the semiconductor layer is partly etched with the first pillar mask and becomes semiconductor strips (not shown) on semiconductor film 103b after the associated etch step. The semiconductor film connects the later-formed semiconductor pillars within respective blocks. A protective dielectric layer may be disposed to fill the spaces created by the first masked etch step. The protective dielectric layer helps to minimize the loss of semiconductor film during the second masked etch step as well as to prevent the toppling of the tall skinny semiconductor strips. Then the second masked etch step etches the semiconductor strips and the dielectric layer simultaneously by the amount of semiconductor etched during the first masked etch step. This is to ensure that at least some portion of the semiconductor film remains between the strips uncovered by the second pillar mask. In the second alternative, the semiconductor layer is completely etched outside the semiconductor pillars and exposes the underlying metallic film. A protective dielectric layer may be used between the first and second masked etch steps in the same manner of the first alternative, so as to minimize any attack on the metallic film during the second masked etch step.

Semiconductor pillars 104 are "bodies" of the memory-cell transistors. A composite gate dielectric is disposed on the semiconductor pillars. A control gate is disposed over the composite gate dielectric, surrounding a middle portion of the semiconductor pillars. In certain technologies, the composite gate dielectric comprises a charge-trap layer sandwiched between first gate dielectric and a second gate dielectric. We will call the first gate dielectric a tunneling dielectric, and the second a coupling dielectric. In some other technologies, the composite gate dielectric comprises a floating gate formed between the tunneling dielectric and a coupling dielectric. The floating gate is completely surround by the two gate dielectrics. The gate stack, comprising the composite gate dielectric and the control gate, is not shown in 3D views but later shown in cross-sectional views.

Figure 1D:
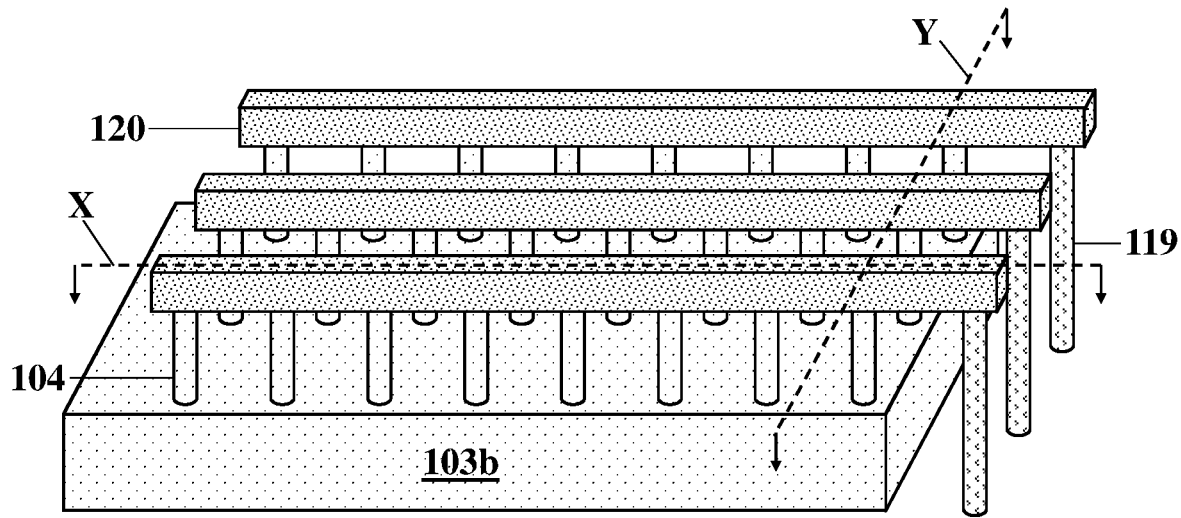
FIG. 1D is structure 100 with further processing on that of FIG. 1C. Vertical transistors are formed of the semiconductor pillars followed by the formation of 3D vias 119 and metal lines 120. The gate stack of each vertical transistor is not shown, though present, in order to avoid overcrowding of the illustration. Substrate 101 and planar circuit region 102 are not shown, though present, in this figure and later figures of the present disclosure.

FIG. 1D illustrates the structure of the first embodiment at a later stage than FIG. 1C. 3D vias 119 are formed outside each block of conductive film and coupled to memory control circuits in the logic layer through one or more interconnect layers (not shown). Metal lines 120 are then formed over the semiconductor pillars and on the 3D vias. The metal lines in conjunction with the 3D vias couple the vertical transistors to the memory control circuits for memory operations such as erase, program, and read. The metal lines stretch in bit-line direction (along dashed line X) and are disjointed in word-line direction (along dashed line Y).

Figure 1E:
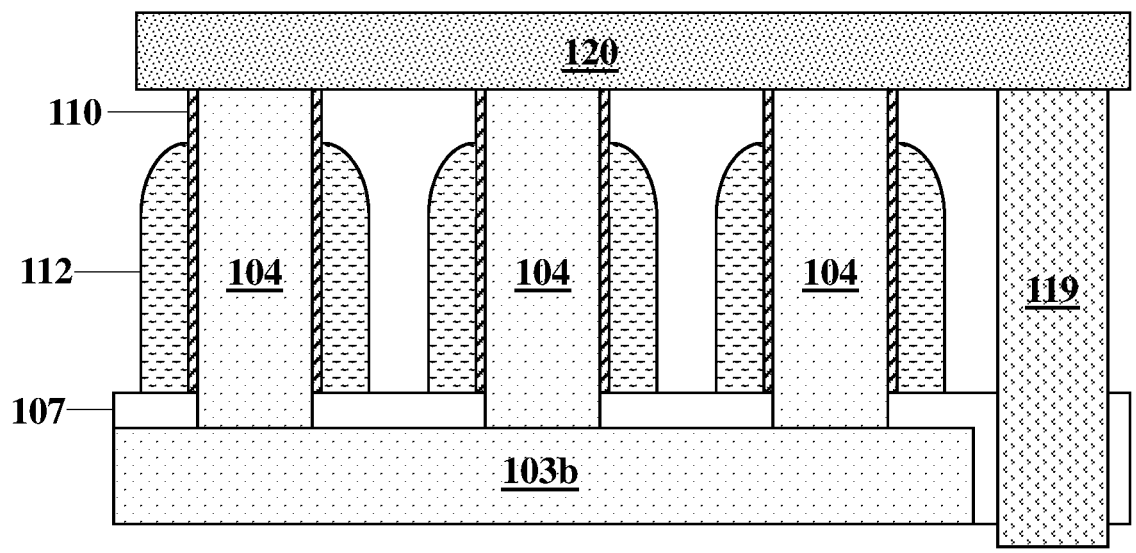
FIG. 1E is a cross-sectional view of FIG. 1D cut vertically along a bit line (indicated by dashed line X in FIG. 1D). Control gate 112 and composite gate dielectric 110 constitute the gate stack of the vertical transistors. The composite gate dielectric consists of multiple layers.
Figure 1F:
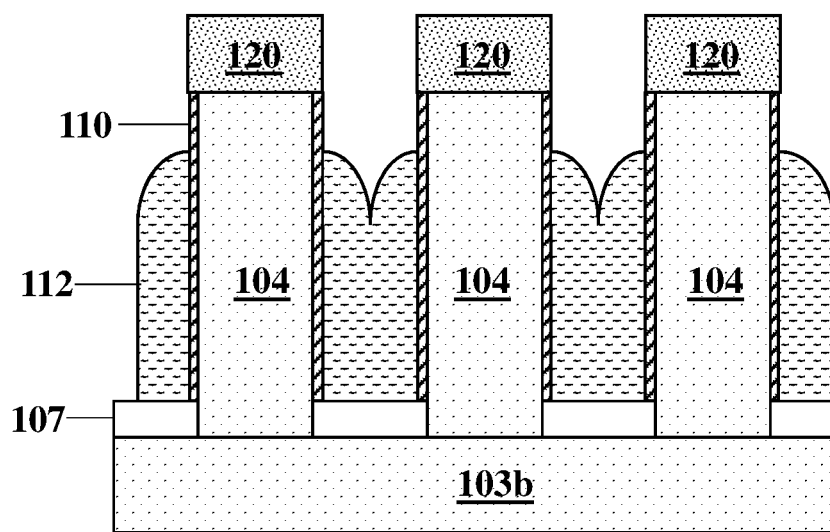
FIG. 1F is a cross-sectional view of FIG. 1D cut vertically along a word line (indicated by dashed line Y in FIG. 1D).

FIGS. 1E-F illustrate cross-sectional views of the structure of the first embodiment. In FIG. 1E, the cross-section is cut vertically along a bit line corresponding to dashed line X of FIG. 1D. FIG. 1F is the cross-section cut vertically along a word line corresponding to dashed line Y of FIG. 1D. In the first embodiment where the conductive film under the semiconductor pillars provides a common node for the pillars in respective blocks of the conductive film, conductive film 103b serves as common source and metal lines 120 serve as bit lines of the memory blocks. There is a dielectric layer (not shown here and in most figures but corresponding to 217 of FIG. 2C) that fills the empty spaces between elements.

It is noteworthy that the memory-cell transistors, each comprising a semiconductor pillar 104, a composite gate dielectric 110, and a control gate 112, are separated at the control gate in bit-line direction (as in FIG. 1E) but joined (or merged) at the control gate in word-line direction (as in FIG. 1F). The difference originates from the different spaces between semiconductor pillars in bit-line and word-line directions. In word-line direction, the pillars are spaced sufficiently close to each other, typically at the minimum feature size of the technology, and the gate stack is sufficiently thick, such that the transistors are merged at their control gate when the material for the control gate is disposed, and remain merged after the control gate material is anisotropically etched. The merged gate along the word-line direction serves as a local word line for the cells along that line. Therefore, it is not necessary to provide a gate contact for each transistor along the word line in order to couple them to an external word line. However, in bit-line direction, the pillars are spaced sufficiently apart from each other, typically at 1.5 times or more of the minimum feature size of the technology, and the gate stack is sufficiently thin, such that the transistors are separated at their control gate upon etching the gate material, in the absence of a mask protecting them from the anisotropical etch. A control gate mask may be used to leave pieces of the gate material where control gate contacts are to be made.

A dielectric film 107 is disposed after patterning the semiconductor pillars but before disposing the gate stack in order to isolate the control gate (as well as the floating gate if used) from conductive film 103b. The disposition of the dielectric film comprises multiple steps. A dielectric material is disposed sufficiently thick such that the lowest point of the top surface is above the semiconductor pillars. Then the dielectric layer is planarized, e.g. by polishing, and etched, whether isotropically or anisotropically, down to a desired depth so as to surround and cover only a bottom portion of the semiconductor pillars. Although the number of transistors in either bit-line or word-line direction is greater than three in actual products, only three of them are shown in the figures for the sake of exemplary simplicity.

We now describe options for the formation of metal lines 120. A first option is to dispose a layer of metallic material on a dielectric layer (corresponding to layer 217 of FIGS. 2C-D) and pattern the layer of metallic material into the metal lines. Prior to disposing the metallic material but after forming the memory cell transistors, the dielectric layer is disposed and planarized until the top horizontal surface of the semiconductor pillars are exposed. In a second option, the dielectric layer remains on the top horizontal surface of the semiconductor pillars after the planarization. Then, grooves are formed in the dielectric layer to expose the top horizontal surface of the semiconductor pillars and are filled with a metallic material.

Figure 2A:
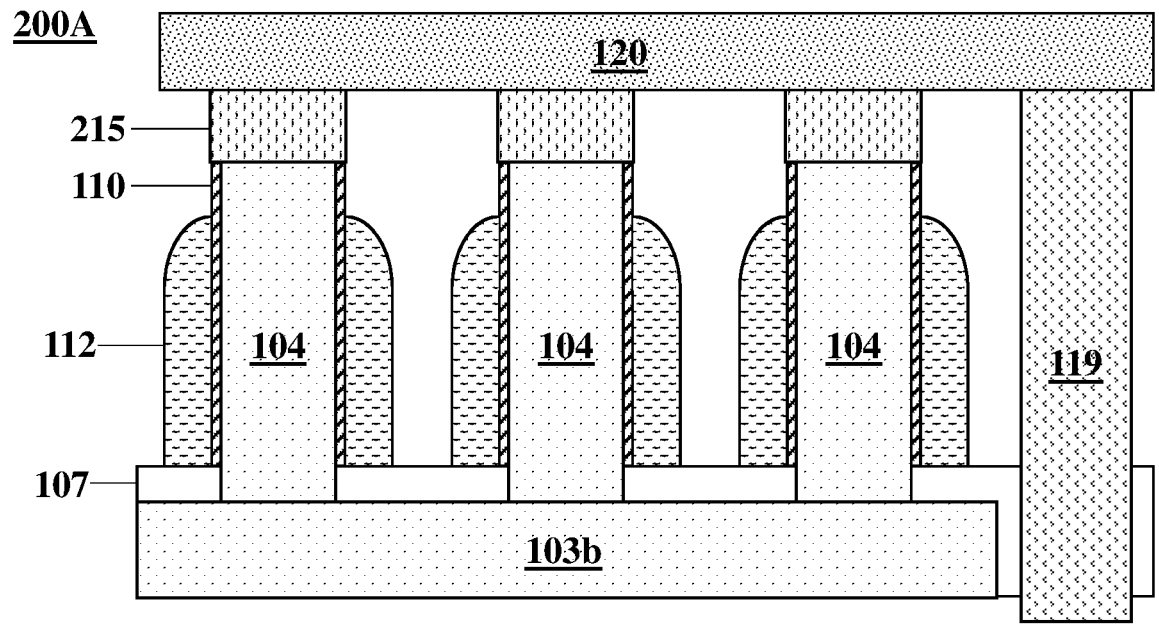
FIG. 2A illustrates a structure 200A having an optional contact plugs 215 disposed on the semiconductor pillars before the formation of metal lines 120.
Figure 2B:
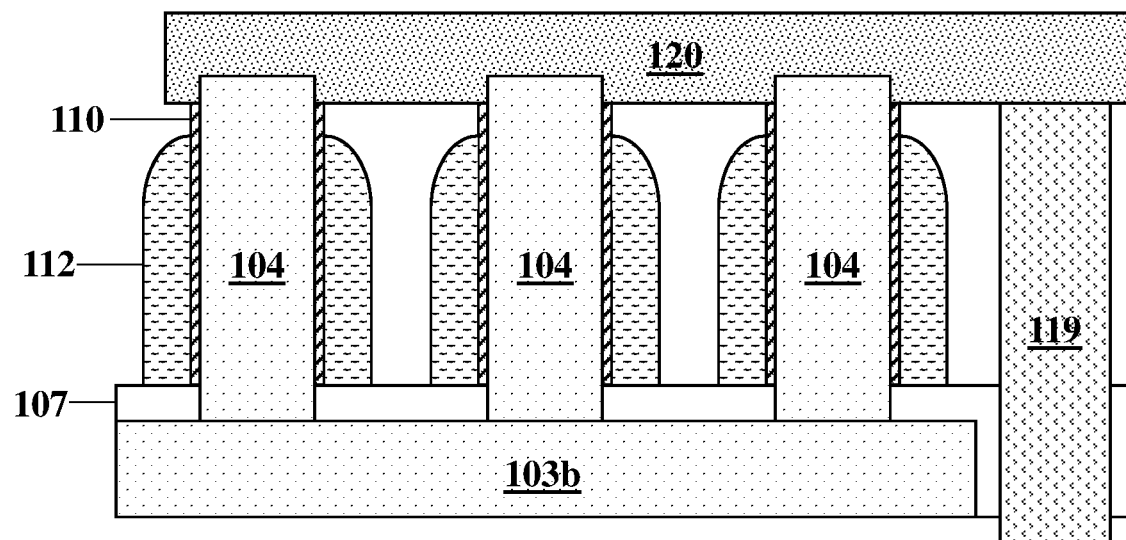
FIG. 2B illustrates a structure 200B as a modification to that of FIGS. 1E-F.

In either option, contact plugs 215 may be formed on the semiconductor pillars before disposing the metal lines, as illustrated by structure 200A in FIG. 2A. The contact plugs or the metal lines in the absence of contact plugs may be in contact with a top portion of the sidewall of the semiconductor pillars in addition to at least a portion of the top horizontal surface of the semiconductor pillars, as illustrated by structure 200B in FIG. 2B. This can be accomplished, for example, by over-polishing the dielectric layer in the first option or by over-etching the dielectric layer in the second option. Contact plugs may also be similarly made in contact with the pillar sidewall, although FIG. 2A illustrates otherwise. Such contacting of pillar sidewall by contact plugs or metal lines reduces contact resistance to the pillars.

Figure 2C:
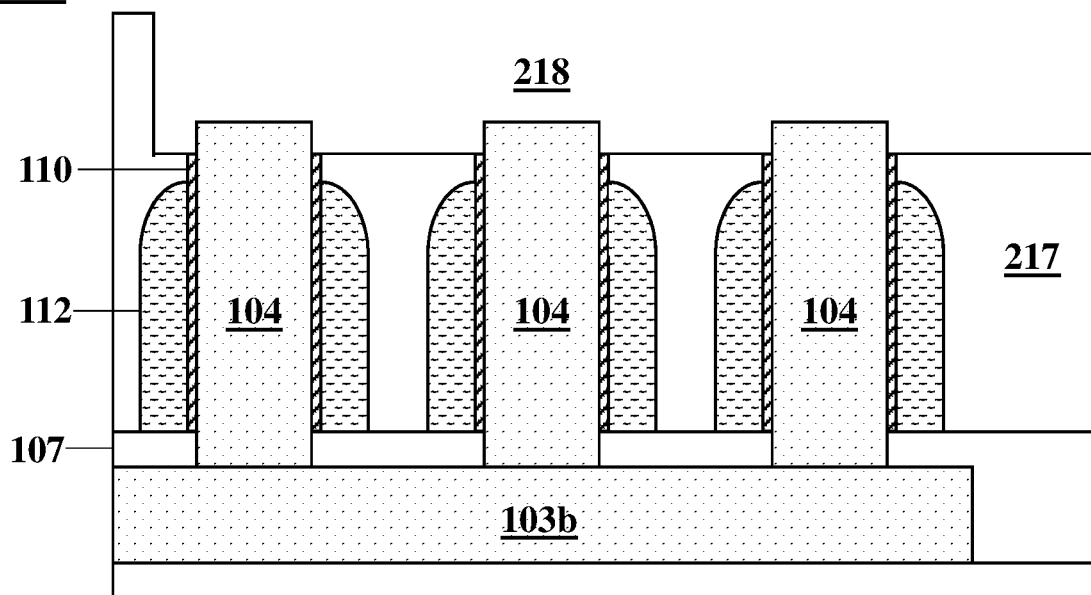
FIGS. 2C-D are structure 200B prior to the disposition of metal lines, according to an option of the first embodiment. A dielectric layer 217 is disposed and patterned before disposing metal lines 120.
Figure 2D:
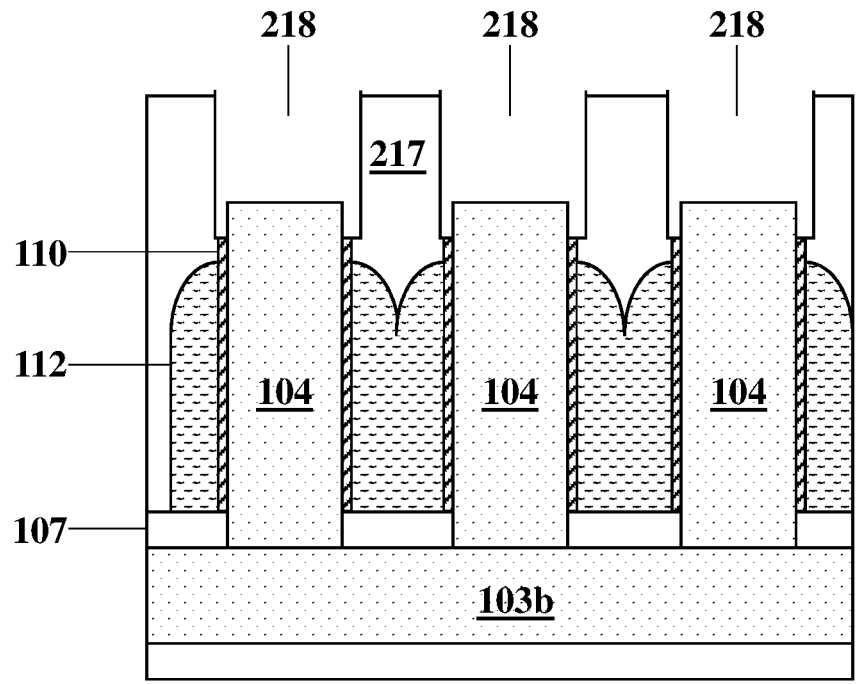

FIGS. 2C-D illustrate an intermediate form of structure 200B before disposing the metal lines in accordance with the second option of forming the metal lines. Dielectric layer 217 is disposed after completing the formation of the memory-cell transistors. Then, with a mask (not shown), grooves 218 are formed in the dielectric layer. The grooves are where metal lines 120 are formed by filling the grooves with a metallic material. FIG. 2C, which is a cross-section in bit-line direction, shows that the grooves stretch in bit-line direction. FIG. 2D is a cross-section in word-line direction and is intended to show that the grooves are disjointed in word-line direction; it incidentally shows that the grooves are wider than the semiconductor pillars, so that the metal lines are in contact with a top portion of the sidewall of the semiconductor pillars in both bit-line and word-line directions. When contact plugs are formed on top of semiconductor pillars, dielectric layer 217 may actually comprise at least two layers, one disposed before and for the formation of the contact plugs, and another disposed after the contact plugs and for the formation of the grooves.

Figure 3A:
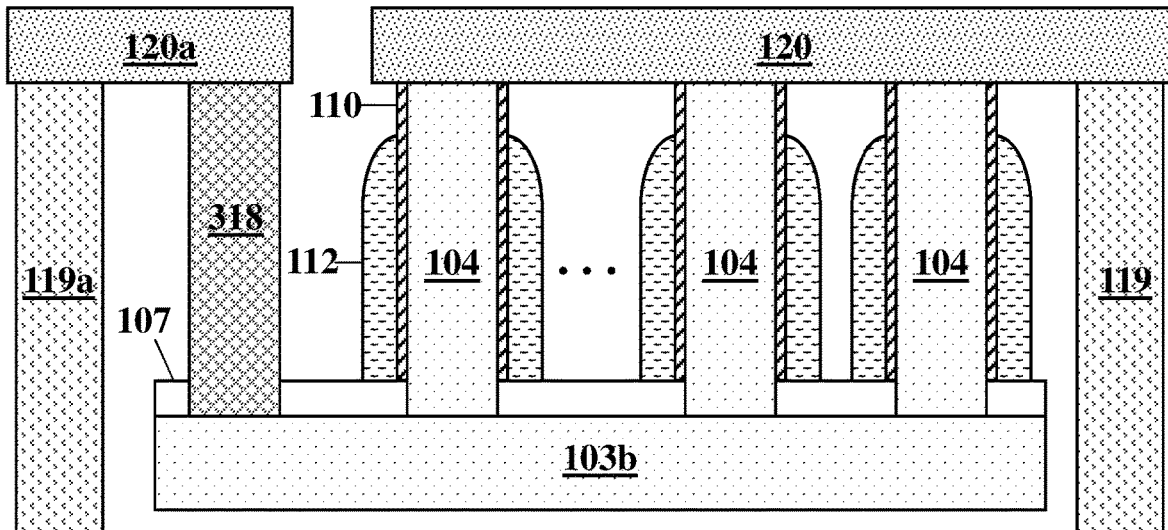
FIG. 3A is a structure 300A illustrating a first option of the first embodiment for the coupling of conductive film 103b to an underlying circuitry.
Figure 3B:
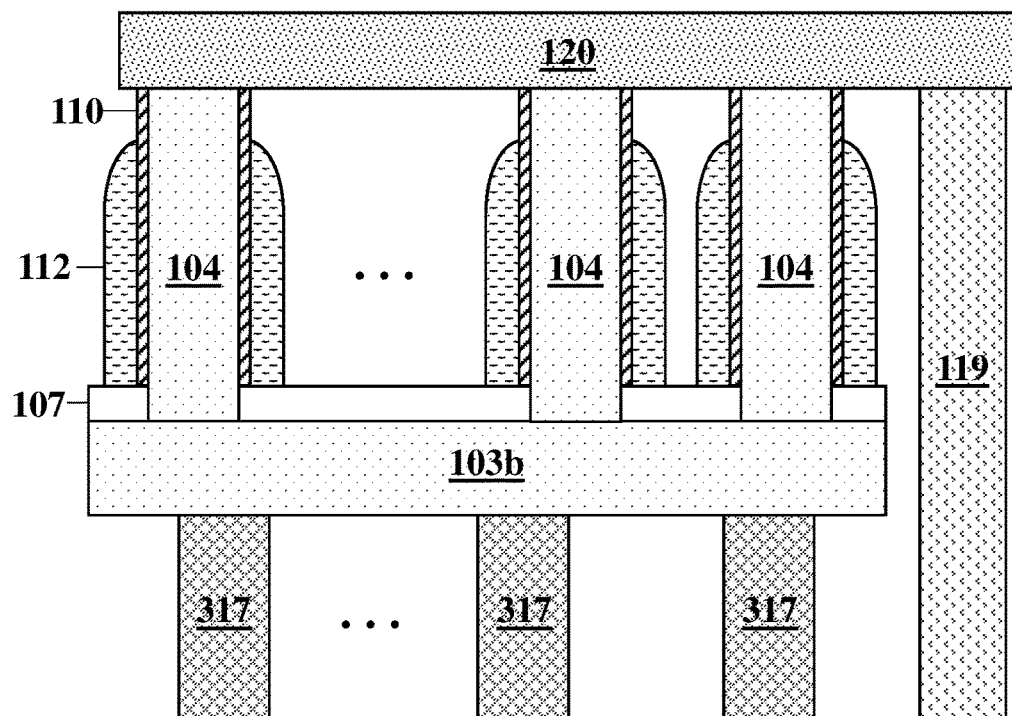
FIG. 3B is a structure 300B illustrating a second option of the first embodiment for the coupling of conductive film 103b to an underlying circuitry.

FIGS. 3A-B illustrate how conductive film 103b which serves as common nodes for the semiconductor pillars in the respective blocks may be coupled to certain common nodes of memory control circuits residing under the memory (i.e. in logic layer 102 of FIGS. 1A-C). A first option is to make contacts 318 on conductive film 103b through a dielectric layer (not shown here but corresponding to 217 of FIGS. 2C-D), as illustrated in FIG. 3A. The contacts couple the conductive film to the underlying memory control circuits through metal lines 120a and 3D vias 119a. Metal lines 120a are formed at the same time as metal lines 120, but labeled differently to distinguish their purposes. The same comment applies to 3D vias 119a vs. 119. A second option, as illustrated in FIG. 3B, of coupling the conductive film to the underlying memory control circuits is to form interconnect vias 317 in logic layer 102, which are exposed at the time of disposing conductive layer 103 of FIG. 1A.

Figure 4A:
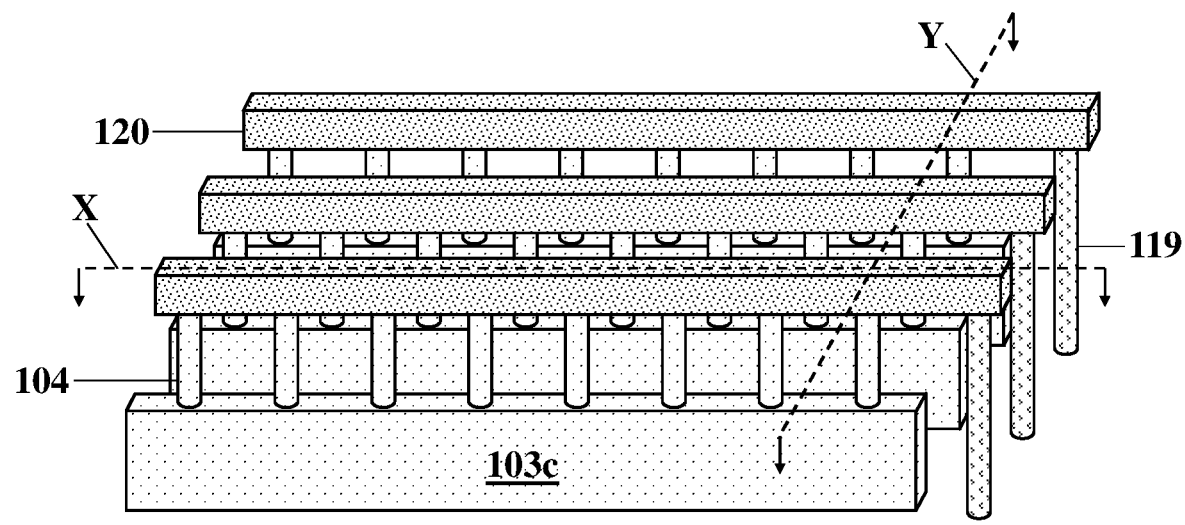
FIG. 4A is a structure 400 illustrating a second embodiment of the present disclosure. Conductive lines 103c and semiconductor pillars 104 are patterned out of conductive layer 103 of FIG. 1A.
Figure 4B:
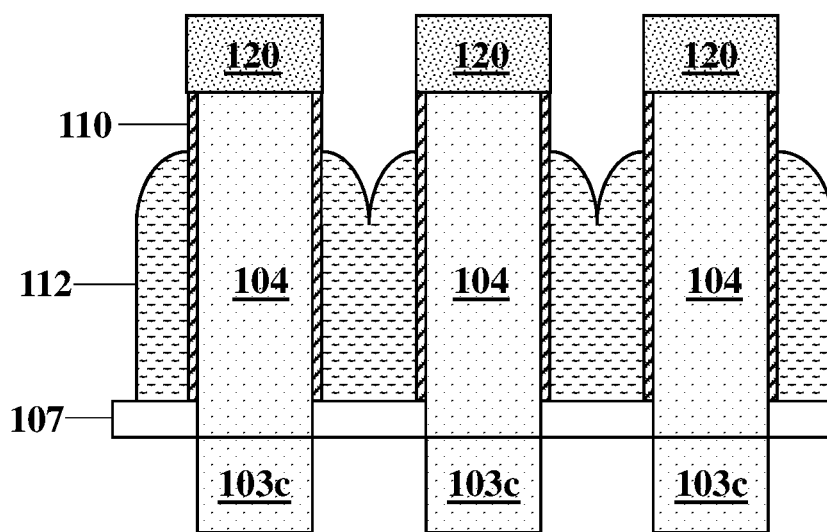
FIG. 4B is a cross-sectional view of FIG. 4A cut vertically along a word line as indicated by dashed line Y in FIG. 4A.

FIGS. 4A-B illustrate a structure 400 in accordance with a second embodiment of the present disclosure. FIG. 4A is a 3D rendering of the structure and FIG. 4B is a cross-sectional view of the structure cut vertically along a word line (corresponding to dashed line Y of FIG. 4A). A semiconductor layer (not shown here but corresponding to 103 of FIG. 1A) is completely etched when the semiconductor layer is patterned with a first pillar mask (not shown) defining semiconductor strips (not shown) that stretch in bit-line direction (indicated by dashed line X). The semiconductor strips are incompletely etched when the semiconductor strips are patterned with a second pillar mask (not shown) defining the final shape of the semiconductor pillars by its intersection with the first pillar mask. As a result, semiconductor lines 103c stretching in bit-line direction and parallel to metal lines 120 are formed out of the semiconductor strips, at the bottom of the semiconductor pillars.

If a metallic film is disposed under semiconductor layer 103 as in the second alternative, both the semiconductor layer and the metallic film are etched completely with the first pillar mask so as to form stacks of metallic lines 103c and semiconductor strips (not shown). But with the second pillar mask, the etching is stopped upon completely etching the semiconductor strips into the semiconductor pillars, leaving the metallic lines intact. The terms "metallic lines" and "metal lines" are distinguished in the present disclosure referring to completely different lines, the former under the semiconductor pillars and the latter over them. The same distinction applies to the terms "metallic film" and "metal layer," the former becoming metallic lines and the latter becoming metal lines. They may be of different materials.

We will use the term "conductive lines" to refer to the semiconductor lines of the first alternative and to the metallic lines of the second alternative. In some applications, the conductive lines serve as bit lines and the metal lines as source lines. In some other applications, the roles of the conductive lines and the metal lines are reversed. Various alternatives and options of the first embodiment are equally applicable to the second embodiment.

An advantage of the second embodiment is that the block mask of the first embodiment is not needed. There is no need to form the blocks of semiconductor layer 103a of FIG. 1B. The first mask for patterning the semiconductor pillars can serve the same purpose of clearing the conductive layer outside and between blocks of memory, because semiconductor layer 103 of FIG. 1A (together with the underlying metallic film if optionally disposed) is completely etched.

Figure 4C:
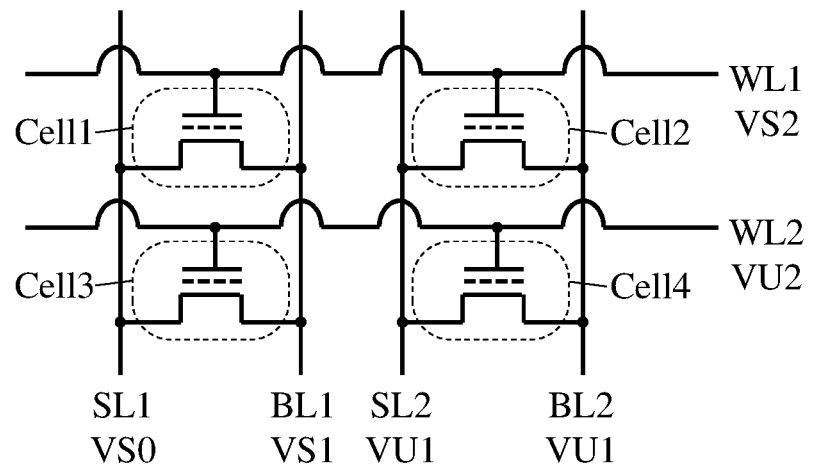
FIG. 4C is a circuit diagram illustrating a disturb reduction scheme available with the second embodiment.

Another advantage of the second embodiment is the ability to adopt a disturb minimization scheme for program and read operations, particularly for unselected cells sharing the same word line or bit line as the selected cell. This is illustrated with a NOR-type 2×2 array of cells in FIG. 4C. Cell1 is the only cell in this illustration that is selected for access, whether for program or read. The other cells are unselected and are disturbed because of the voltages appearing on their lines which are shared with the selected cell. Cell2 undergoes a first disturb because it is on the same word line with Cell1. Cell3 undergoes a second disturb because it shares the source and bit lines with Cell1. Cell4 undergoes little or no disturb because it does not share any bias line with Cell1. The dashed line between the control gate (coupled to word lines) and the channel of each memory-cell transistor represents the charge-trap layer or floating gate of the NVM.

For the selected cell Cell1, its bit line BL1 and its word line WL1 are biased to sufficiently high voltages, VS1 and VS2 respectively. VS0, the voltage on the source line SL1 of the selected cell, is zero or a local ground in some applications or of opposite polarity than VS1 and VS2 in some other applications. In general, the voltage VS2 on WL1 is higher than the voltage VS1 on BL1 in most (if not all) relatively advanced technology nodes. This is because of the scaling of transistor channel length that affords continually lower voltage for VS1 and because of the non-scaling of the thicknesses of tunneling dielectric and coupling dielectric that limits the voltage scaling of VS2 significantly. If the cells in a memory block shared a common source line as in the first embodiment, the voltage on the source line of unselected cells would have to be same as that on the source line of selected cell. In such a case, VU1, the voltage on the source line SL2 of the unselected cell, would have to be equal to VS0, making the voltage across unselected cells (such as Cell2) on the same word line as the selected cell identical to that across the selected cell between one pair of terminals, which in this case is between the gate and source of the transistors.

However, in the second embodiment where separate source lines can be used for cells at different bit lines, the unselected cells sharing a word line with the selected cell can be biased so as to have a lower voltage across their terminals. It is achieved by applying an intermediate voltage to their source lines and bit lines. The intermediate voltage is between two extreme voltages applied to the selected cell. Since source lines are separate, VU1 on the source line of Cell2 in FIG. 4C can be somewhere between VS0 and the higher of VS1 and VS2. By biasing its bit line BL2 at the same voltage, there will be no current flowing through Cell2. Since the voltage across any pair of terminals is much lower than that of Cell1, Cell2 in the second embodiment is subject to much less disturb than in the first embodiment. Cell3 which shares source and bit lines as Cell1 can undergo a less disturb by biasing its word line WL2 at a lower voltage VU2 than the selected word-line voltage VS2. Usually, VU2 is chosen to turn off the cells on unselected word lines, especially during read. An optimum design would choose VU1 and VU2 so as to make the voltages across the composite gate dielectric of unselected cells on the selected word line close or equal to that for unselected cells on the selected bit line.

One concern may lie with a relatively high parasitic resistance along the conductive lines of the second embodiment than along the conductive film of the first embodiment. A voltage drop from one end of a conductive line to the other makes the operations of program and read non-uniform. In addition, signals propagate slowly from one end of the conductive line to the other because of the parasitic resistance. The problem is worse if the conductive lines are made of a semiconductor material rather than a metallic material. Often these problems are addressed by limiting the application to relatively slow operations and/or by tolerating higher disturb or shorter endurance. Use of a thicker conductive film to lower the parasitic resistance entails a yield loss due to toppling when the semiconductor strips (plus the metallic lines of the second alternative) are formed at the first masking step toward formation of semiconductor pillars.

Figure 4D:
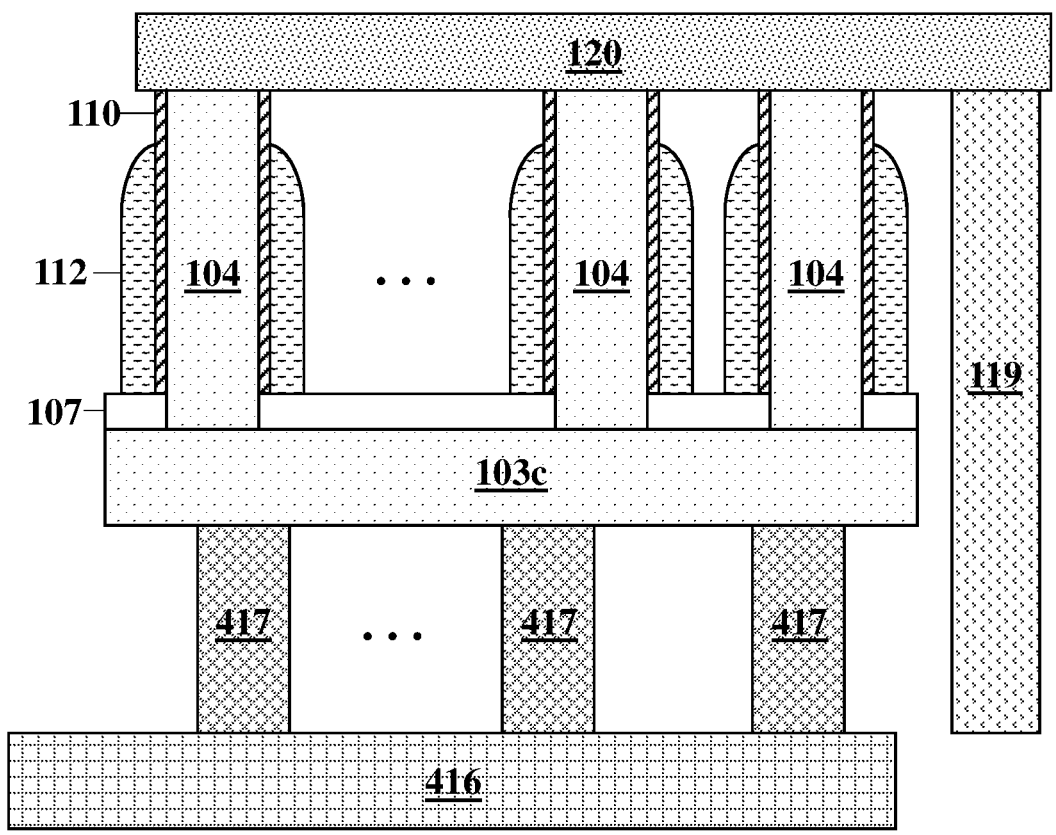
FIG. 4D is a structure 400A illustrating an option of the second embodiment that uses bypass metal lines 416 in parallel with and shorted to respective conductive lines 103c.

A scheme that addresses the high-resistance concern without the penalty of slow operation or disturb tolerance or without the risk of yield loss is illustrated in FIG. 4D. A metallic layer (not shown) of low resistance is disposed in the logic layer underlying the memory cells. The metallic layer is patterned into bypass metal lines 416 identical in pitch to conductive lines 103c. Then, bypass vias 417 are formed on each bypass metal line, like interconnect vias 317 of FIG. 3B. The bypass vias are exposed when conductive layer 103 of FIG. 1A is disposed, shorting the later formed conductive lines to the respective underlying bypass metal lines. The bypass metal lines may be coupled to various nodes of underlying memory control circuits through one or more interconnect layers of metal lines and vias underlying the bypass metal lines. An alternative to using the bypass vias is to form contacts on the conductive lines in a manner illustrated in FIG. 3A but with at least one contact on each end of the conductive lines, albeit with a less reduction in overall resistance along signal paths.

As used throughout the present disclosure, the word "may" is used in a permissive sense (i.e., meaning "having the potential to"), rather than a mandatory sense (i.e., meaning "must" or "required to"). Similarly, the words "include," "including," and "includes" mean "including, but not limited to" the listed item(s).

The foregoing descriptions of specific embodiments of the present disclosure have been presented for purposes of illustration and description. The embodiments were chosen and described in order to explain the principles of the invention and its practical application in the best way, and thereby enable others skilled in the art to best utilize the invention and various embodiments with various modifications as are suited to the particular use contemplated. They are not intended to be exhaustive or to limit the invention to the precise forms disclosed. Many modifications, variations, and rearrangements are possible in light of the above teaching without departing from the broader spirit and scope of the various embodiments. For example, they can be in different sequences than the exemplary ones described herein, e.g., in a different order. One or more additional new elements or steps may be inserted within the existing structures or methods or one or more elements or steps may be abbreviated or eliminated, according to a given application, so long as substantially equivalent results are obtained. Accordingly, structures and methods construed in accordance with the principle, spirit, and scope of the present invention may well be embraced as exemplarily described herein. It is intended that the scope of the invention be defined by the Claims appended hereto and their equivalents.

I claim:

1. A 3D NVM module, comprising:
   a logic layer formed on a substrate and comprising a memory control circuit;
   blocks of conductive film disposed over said logic layer;

semiconductor pillars formed and arranged in an array on each of said blocks of conductive film, and forming bodies of vertical transistors;

a tunneling dielectric disposed on at least a portion of each of said semiconductor pillars;

a coupling dielectric disposed over said tunneling dielectric;

a control gate disposed on said coupling dielectric and surrounding a middle portion of each of said semiconductor pillars;

a first set of 3D vias formed on said logic layer outside or between said blocks of conductive film;

a first set of metal lines disposed over said semiconductor pillars and on said first set of 3D vias;

and wherein:
   said array has a bit-line direction and a word-line direction, perpendicular to each other;
   said first set of 3D vias are coupled to said memory control circuit;
   said first set of metal lines stretch in said bit-line direction; and
   each of said first set of metal lines couples said one or more of said first set of 3D vias to a respective group of said semiconductor pillars that are along a respective line stretching in said bit-line direction.

2. The 3D NVM module of claim 1, wherein:
said blocks of conductive film are blocks of semiconductor film.

3. The 3D NVM module of claim 2, wherein:
said blocks of semiconductor film and said semiconductor pillars are formed from a same semiconductor layer disposed over said logic layer.

4. The 3D NVM module of claim 1, wherein:
said first set of metal lines are partly in contact with a top portion of a vertical sidewall of said semiconductor pillars as well as with at least a portion of a top horizontal surface of said semiconductor pillars.

5. The 3D NVM module of claim 1, further comprising:
contact plugs disposed on said semiconductor pillars under said first set of metal lines;
wherein:
   each of said semiconductor pillars has respective one of said contact plugs.

6. The 3D NVM module of claim 1, further comprising:
contacts disposed on each of said blocks of conductive film;
a second set of 3D vias formed outside or between said blocks of conductive film;
a second set of metal lines disposed on said contacts and said second set of 3D vias;
and wherein:
   each of said second set of metal lines couples one or more of said contacts to respective one or more of said second set of 3D vias; and
   said blocks of conductive film are coupled to a common node or respective common nodes in said logic layer, each by respective one or more of said contacts in conjunction with respective one or more of said second set of 3D vias and respective one or more of said second set of metal lines.

7. The 3D NVM module of claim 1, further comprising:
interconnect vias formed in said logic layer, immediately under each of said blocks of conductive film;
wherein:
   said blocks of conductive film are coupled to a common node or respective common nodes in said logic layer, each by respective one or more of said interconnect vias.

8. The 3D NVM module of claim 1, further comprising:
a charge-trap layer disposed on said tunneling dielectric under said coupling dielectric.

9. The 3D NVM module of claim 1, further comprising:
a floating gate disposed on said tunneling dielectric under said coupling dielectric; wherein:
   said floating gate is sufficiently thin such that said vertical transistors are separated at said floating gate in both said bit-line direction and said word-line direction; and
   said floating gate is completely surrounded by said tunneling dielectric and said coupling dielectric.

10. The 3D NVM module of claim 1, further comprising:
a dielectric film disposed up to a bottom portion of said semiconductor pillars.

11. The 3D NVM module of claim 1, wherein:
said memory control circuit is configured to operate said 3D NVM module as a NOR flash.

12. The 3D NVM module of claim 1, wherein:
said memory control circuit is configured to operate said 3D NVM module like a NAND flash.

13. The 3D NVM module of claim 1, further comprising:
a programmable configuration register constructed in said logic layer;
wherein:
   said memory control circuit is configured to operate said 3D NVM module as a NOR flash when a first value is stored in said programmable configuration register; and
   said memory control circuit is configured to operate said 3D NVM module like a NAND flash when a second value is stored in said programmable configuration register.

14. The 3D NVM module of claim 1, wherein:
said 3D NVM module is partitioned into a first partition and a second partition;
said memory control circuit is configured to operate said first partition as a NOR flash; and
said memory control circuit is configured to operate said second partition like a NAND flash.

15. The 3D NVM module of claim 14, further comprising:
a programmable configuration register constructed in said logic layer;
wherein:
   said programmable configuration register configures a boundary between said first partition and said second partition anywhere within said 3D NVM module, including cases where said first partition and said second partition are all and none, respectively, or none and all, respectively, of said 3D NVM module.

16. A 3D NVM module, comprising:
a logic layer formed on a substrate and comprising a memory control circuit; and
blocks of memory array formed on said logic layer, with each of said blocks of memory array comprising:
conductive lines formed over said logic layer and parallel to one another;
semiconductor pillars formed on said conductive lines, arranged in an array, and forming bodies of vertical transistors;
a composite gate dielectric disposed on each of said semiconductor pillars;

a control gate disposed on said composite gate dielectric and surrounding a middle portion of each of said semiconductor pillars;
a first set of 3D vias formed on said logic layer outside or between said blocks of memory array;
a first set of metal lines disposed over said semiconductor pillars and on said first set of 3D vias;
and wherein:
  said array has a bit-line direction and a word-line direction, perpendicular to each other;
  said conductive lines and said first set of metal lines stretch in said bit-line direction;
  said first set of 3D vias are coupled to said memory control circuit; and
  each of said first set of metal lines couples respective one or more of said first set of 3D vias to a respective group of said semiconductor pillars that are along a respective line stretching in said bit-line direction.

17. The 3D NVM module of claim 16, wherein:
said conductive lines are semiconductor lines.

18. The 3D NVM module of claim 17, wherein:
said semiconductor lines and said semiconductor pillars are formed from a same semiconductor layer disposed over said logic layer.

19. The 3D NVM module of claim 16, wherein:
said first set of metal lines are partly in contact with a top portion of a vertical sidewall of said semiconductor pillars as well as with at least a portion of a top horizontal surface of said semiconductor pillars.

20. The 3D NVM module of claim 16, further comprising:
contact plugs disposed on said semiconductor pillars under said first set of metal lines;
wherein:
  each of said semiconductor pillars has respective one of said contact plugs.

21. The 3D NVM module of claim 16, further comprising:
contacts disposed on said conductive lines;
a second set of 3D vias formed outside or between said blocks of memory array;
a second set of metal lines disposed on said contacts and said second set of 3D vias;
and wherein:
  each of said second set of metal lines couples respective one or more of said contacts to respective one or more of said second set of 3D vias; and
  said conductive lines are coupled to said memory control circuit, each through respective one or more of said contacts in conjunction with respective one or more of said second set of 3D vias and respective one or more of said second set of metal lines.

22. The 3D NVM module of claim 16, further comprising:
interconnect vias disposed immediately under said conductive lines; wherein:
  said conductive lines are coupled to said memory control circuit, each through respective one or more of said interconnect vias.

23. The 3D NVM module of claim 16, further comprising:
word lines stretching in said word-line direction;
wherein:
  each of said word lines is coupled to said control gate of said vertical transistors that are formed along a respective line stretching in said word-line direction;
  said memory control circuit is configured to bias said vertical transistors in said 3D NVM by selecting some of said word lines, some of said conductive lines, and some of said metal lines, while unselecting a remainder of said word lines, a remainder of said conductive lines, and a remainder of said metal lines;
  said some of said word lines, said some of said conductive lines, and said some of metal lines are coupled to a first group of said vertical transistors;
  a first high bias is applied to said some of said word lines;
  a low bias is applied to either of said some of said conductive lines and said some of said metal lines;
  a second high bias is applied to said some of said conductive lines or said some of said metal lines to which said low bias is not applied;
  a first intermediate bias is applied to both said remainder of said conductive lines and said remainder of said metal lines;
  a second intermediate bias is applied to said remainder of said word lines; and
  said first intermediate bias and said second intermediate bias are higher than said low bias and lower than said first high bias or said second high bias.

24. The 3D NVM module of claim 23, wherein:
said second high bias is higher than said low bias and lower than said first high bias.

25. The 3D NVM module of claim 23, wherein:
said second intermediate bias is chosen to turn off a second group of said vertical transistors that are coupled to said remainder of said word lines.

26. The 3D NVM module of claim 16, further comprising:
interconnect vias disposed in said logic layer and immediately under said conductive lines;
wherein:
  said conductive lines are coupled to respective nodes of said logic layer, each through respective one or more of said interconnect vias.

27. The 3D NVM module of claim 26, further comprising:
bypass metal lines disposed in said logic layer and parallel to one another;
underlying vias disposed immediately under each of said bypass metal lines;
and wherein:
  said bypass metal lines are directly under respective said conductive lines;
  each of said bypass metal lines is coupled to respective one of said conductive lines by respective one or more of said interconnect vias; and
  said bypass metal lines are coupled to said respective nodes of said logic layer, each through respective one or more of said underlying vias.

28. The 3D NVM module of claim 16, further comprising:
a dielectric film disposed up to a bottom portion of said semiconductor pillars.

29. The 3D NVM module of claim 16, wherein:
said memory control circuit is configured to operate said 3D NVM module as a NOR flash.

30. The 3D NVM module of claim 16, wherein:
said memory control circuit is configured to operate said 3D NVM module like a NAND flash.

31. The 3D NVM module of claim 16, further comprising:
a programmable configuration register constructed in said logic layer;
wherein:
  said memory control circuit is configured to operate said 3D NVM module as a NOR flash when a first value is stored in said programmable configuration register; and said memory control circuit is configured to operate said 3D NVM module like a NAND flash when a second value is stored in said programmable configuration register.

32. The 3D NVM module of claim 16, wherein:
said 3D NVM module is partitioned into a first partition and a second partition;
said memory control circuit is configured to operate said first partition as a NOR flash; and
said memory control circuit is configured to operate said second partition like a NAND flash.

33. The 3D NVM module of claim 32, further comprising:
a programmable configuration register constructed in said logic layer;
wherein:
said programmable configuration register configures a boundary between said first partition and said second partition anywhere within said 3D NVM module, including cases where said first partition and said second partition are all and none, respectively, or none and all, respectively, of said 3D NVM module.

34. The 3D NVM module of claim 16, wherein:
said conductive lines serve as source lines for said 3D NVM module; and
said metal lines serve as bit lines for said 3D NVM module.

35. The 3D NVM module of claim 16, wherein:
said conductive lines serve as bit lines for said 3D NVM module; and
said metal lines serve as source lines for said 3D NVM module.

36. A 3D NVM module, comprising:
a conductive film divided into lines;
semiconductor pillars formed on said conductive film, arranged in an array, and forming bodies of vertical transistors;
a composite gate dielectric disposed on each of said semiconductor pillars;
a control gate disposed on said composite gate dielectric and surrounding a middle portion of each of said semiconductor pillars;
word lines disposed over said vertical transistors;
bit lines disposed over said vertical transistors;
and wherein:
said array has a bit-line direction and a word-line direction, perpendicular to each other;
said word lines are coupled to said control gate of said vertical transistors which are respectively arranged along said word-line direction;
said bit lines are coupled to top region of said semiconductor pillars which are respectively arranged along said bit-line direction;
a spacing between said semiconductor pillars along said word-line direction is smaller than a spacing between said semiconductor pillars along said bit-line direction;
said lines of said conductive film are sufficiently narrow in said word-line direction such that each of said lines of said conductive film can accommodate only one of said vertical transistors in said word-line direction; and
said lines of said conductive film provide common nodes for respective groups of said vertical transistors which are arranged along said bit-line direction.

37. The 3D NVM module of claim 36, further comprising:
a substrate;
a circuitry formed on said substrate and comprising planar transistors, dielectric layers, and interconnect layers;
wherein:
said conductive film is formed over said circuitry.

38. The 3D NVM module of claim 37, further comprising:
3D vias coupled to said circuitry;
contacts formed on said conductive film;
metal lines disposed on said contacts and said 3D vias and over said vertical transistors;
and wherein:
said conductive film is coupled to said circuitry through said contacts, said metal lines, and said 3D vias.

39. The 3D NVM module of claim 37, further comprising:
underlying vias formed in a top region of said circuitry;
wherein:
said conductive film is disposed on said underlying vias; and
said conductive film is coupled to said circuitry through said underlying vias.

40. The 3D NVM module of claim 36, wherein:
said semiconductor pillars are formed of single-crystalline semiconductor.

41. A 3D NVM module, comprising:
conductive lines;
semiconductor pillars formed on said conductive lines, and arranged in an array, and forming bodies of vertical transistors;
a composite gate dielectric disposed on each of said semiconductor pillars; and
a control gate disposed on said composite gate dielectric and surrounding a middle portion of each of said semiconductor pillars;
word lines disposed over said vertical transistors;
metal lines disposed over said vertical transistors;
and wherein:
said array has a bit-line direction and a word-line direction, perpendicular to each other;
said conductive lines are sufficiently narrow in said word-line direction such that each of said conductive lines can accommodate only one of said vertical transistors in said word-line direction;
said word lines are coupled to said control gate of said vertical transistors which are respectively arranged along said word-line direction;
said metal lines are coupled to a top region of said vertical transistors which are respectively arranged along said bit-line direction; and
said metal lines run parallel with said conductive lines.

42. The 3D NVM module of claim 41, further comprising:
a substrate;
a circuitry formed on said substrate under said conductive lines;
and wherein:
said circuitry comprises planar transistors, dielectric layers, and interconnect layers.

43. The 3D NVM module of claim 42, further comprising:
3D vias coupled to said circuitry;
contacts formed on said conductive lines;
metal lines disposed on said contacts and said 3D vias and over said vertical transistors;
and wherein:
said conductive lines are coupled to said circuitry, each through respective one or more of said contacts, respective one of said metal lines, and respective one or more of said 3D vias.

44. The 3D NVM module of claim 42, comprising:
underlying vias formed over said circuitry; wherein:

said conductive lines are disposed on respective group of said underlying vias; and said conductive lines are coupled to said circuitry through respective group of said underlying vias.

45. The 3D NVM module of claim 41, wherein:

said semiconductor pillars are formed of single-crystalline semiconductor.

46. The 3D NVM module of claim 41, wherein:

said conductive lines are bit lines for said 3D NVM module; and said metal lines are source lines for said 3D NVM module.

\* \* \* \* \*